(12) United States Patent
Koo et al.

(10) Patent No.: US 11,895,767 B2
(45) Date of Patent: Feb. 6, 2024

(54) ELECTRONIC DEVICE FILLED WITH PHASE CHANGE MATERIAL BETWEEN PLURALITY OF CIRCUIT BOARDS CONNECTED BY CONNECTING MEMBERS

(71) Applicant: Samsung Electronics Co., Ltd., Gyeonggi-do (KR)

(72) Inventors: Kyungha Koo, Gyeonggi-do (KR); Hongki Moon, Gyeonggi-do (KR); Chihwan Jeong, Gyeonggi-do (KR); Kuntak Kim, Gyeonggi-do (KR); Yunjeong Park, Gyeonggi-do (KR); Seungjoo Lee, Gyeonggi-do (KR); Haejin Lee, Gyeonggi-do (KR); Seyoung Jang, Gyeonggi-do (KR)

(73) Assignee: Samsung Electronics Co., Ltd

( * ) Notice: Subject to any disclaimer, the term of this patent is extended or adjusted under 35 U.S.C. 154(b) by 162 days.

(21) Appl. No.: 17/286,007

(22) PCT Filed: Oct. 15, 2019

(86) PCT No.: PCT/KR2019/013493
§ 371 (c)(1),
(2) Date: Apr. 16, 2021

(87) PCT Pub. No.: WO2020/085706
PCT Pub. Date: Apr. 30, 2020

(65) Prior Publication Data
US 2021/0392736 A1     Dec. 16, 2021

(30) Foreign Application Priority Data
Oct. 22, 2018 (KR) .......................... 10-2018-0126108

(51) Int. Cl.
| H05K 1/02 | (2006.01) |
| H05K 1/14 | (2006.01) |
| H05K 1/18 | (2006.01) |

(52) U.S. Cl.
CPC .......... *H05K 1/0203* (2013.01); *H05K 1/144* (2013.01); *H05K 1/18* (2013.01); *H05K 2201/047* (2013.01)

(58) Field of Classification Search
None
See application file for complete search history.

(56) References Cited

U.S. PATENT DOCUMENTS 6,703,128 B2   3/2004   Myers et al.
7,626,817 B2   12/2009  Rapp
(Continued)

FOREIGN PATENT DOCUMENTS

| JP | 2001111232 | 4/2001 |
| KR | 100641604 | 11/2006 |
| KR | 1020170132139 | 12/2017 |

OTHER PUBLICATIONS

PCT/ISA/210 Search Report issued on PCT/KR2019/013493, dated Jan. 20, 2020, pp. 5.
(Continued)

*Primary Examiner* — Courtney L Smith
(74) *Attorney, Agent, or Firm* — The Farrell Law Firm, P.C.

(57) ABSTRACT

Various embodiments of the present invention relate to an electronic device including a stacked circuit board. The electronic device comprises: a first circuit board; a second circuit board; one or more circuit elements disposed on the second circuit board; and a connecting member disposed between the first circuit board and the second circuit board facing the first circuit board to form an internal space surrounding at least some of the one or more circuit ele-
(Continued)

ments, and to electrically connect the first and second circuit boards, wherein the internal space may be filled with a phase change material (PCM) that absorbs heat generated by the at least some circuit elements to change the state of the material. Various other embodiments of the present invention may be additionally provided.

13 Claims, 12 Drawing Sheets

(56) References Cited

U.S. PATENT DOCUMENTS

| | | | | |
|---|---|---|---|---|
| 9,313,875 | B2* | 4/2016 | Wikander | H05K 1/0209 |
| 9,997,494 | B2* | 6/2018 | Kim | H01L 29/0657 |
| 10,499,507 | B2* | 12/2019 | Kim | H01L 25/00 |
| 11,016,546 | B2* | 5/2021 | Li | H01L 23/4275 |
| 11,379,022 | B2* | 7/2022 | Park | H04B 1/3827 |
| 11,387,224 | B2* | 7/2022 | Xu | H01L 25/0655 |
| 2005/0270750 | A1 | 12/2005 | Sarno et al. | |
| 2009/0154113 | A1 | 6/2009 | MacDonald | |
| 2010/0033940 | A1 | 2/2010 | Yamaguchi et al. | |
| 2012/0182693 | A1* | 7/2012 | Boday | H01L 23/3737 252/78.3 |
| 2016/0176703 | A1* | 6/2016 | Baillin | B81B 7/0038 216/72 |
| 2017/0103937 | A1* | 4/2017 | Hsieh | H01L 23/4275 |
| 2018/0138387 | A1 | 5/2018 | Wong et al. | |

OTHER PUBLICATIONS

PCT/ISA/237 Written Opinion issued on PCT/KR2019/013493, dated Jan. 20, 2020, pp. 4.
Korean Office Action dated Apr. 25, 2023 issued in counterpart application No. 10-2018-0126108, 13 pages.

* cited by examiner

ELECTRONIC DEVICE FILLED WITH PHASE CHANGE MATERIAL BETWEEN PLURALITY OF CIRCUIT BOARDS CONNECTED BY CONNECTING MEMBERS

PRIORITY

This application is a National Phase Entry of PCT International Application No. PCT/KR2019/013493 which was filed on Oct. 15, 2019, and claims priority to Korean Patent Application No. 10-2018-0126108, which was filed on Oct. 22, 2018, the content of each of which is incorporated herein by reference.

TECHNICAL FIELD

Various embodiments of the disclosure relate to an electronic device including a stack-up circuit board.

BACKGROUND ART

Electronic devices are being miniaturized or slimmed down, and printed circuit boards (PCBs) embedded in electronic devices are also being miniaturized or slimmed.

Types of printed circuit boards are classified into a single-sided printed circuit board in which wiring lines are formed on only one side of an insulating board, a double-sided printed circuit board in which wiring lines are formed on both sides, and a stack-up printed circuit board formed by stacking a plurality of printed circuit boards.

DISCLOSURE OF INVENTION

Technical Problem

In recent electronic devices, stack-up printed circuit boards are widely used in order to reduce an area.

A conventional stack-up printed circuit board includes a thermal interface material (TIM) provided in a portion of the space between two printed circuit boards which face each other to dissipate heat generated from components.

However, as the performance of components mounted on a printed circuit board is continuously improved, a problem may occur with the prior art in that heat generated from the components cannot be efficiently dissipated and transmitted.

Various embodiments of the disclosure are capable of providing an electronic device capable of efficiently dissipating and transmitting heat generated from components mounted on a printed circuit board.

Solution to Problem

According to various embodiments of the disclosure, an electronic device may include: a first circuit board; a second circuit board; one or more circuit elements disposed on the second circuit board; a connecting member disposed between the first circuit board and the second circuit board facing the first circuit board to form an internal space surrounding at least some of the one or more circuit elements, and to electrically connect the first circuit board and the second board; and a phase change material (PCM) disposed in the internal space and configured to change the state thereof by absorbing heat generated by the at least some circuit elements.

According to various embodiments of the disclosure, an electronic device may include: a first circuit board; a second substrate facing the first substrate; a connecting member disposed between the first circuit board and the second circuit board to form an internal space, and to electrically connect the first circuit board and the second board; and a phase change material (PCM) disposed in the internal space and configured to change the state thereof by absorbing thermal energy.

Advantageous Effects of Invention

An electronic device according to various embodiments of the disclosure is capable of efficiently dissipating and transmitting heat generated from components mounted on a printed circuit board.

MODE FOR CARRYING OUT THE INVENTION

Figure 1:
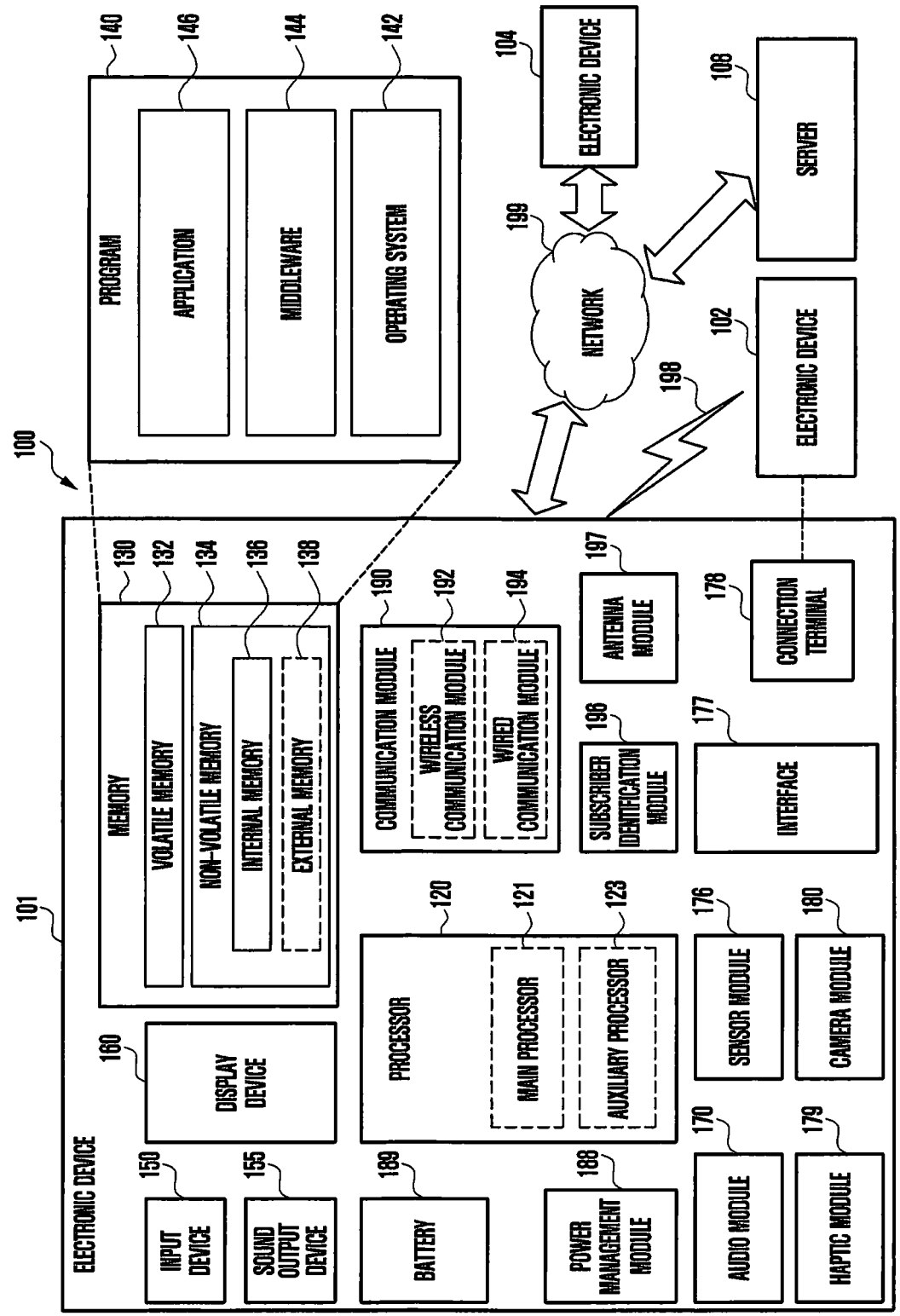
FIG. 1 is a block diagram of an electronic device according to various embodiments in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
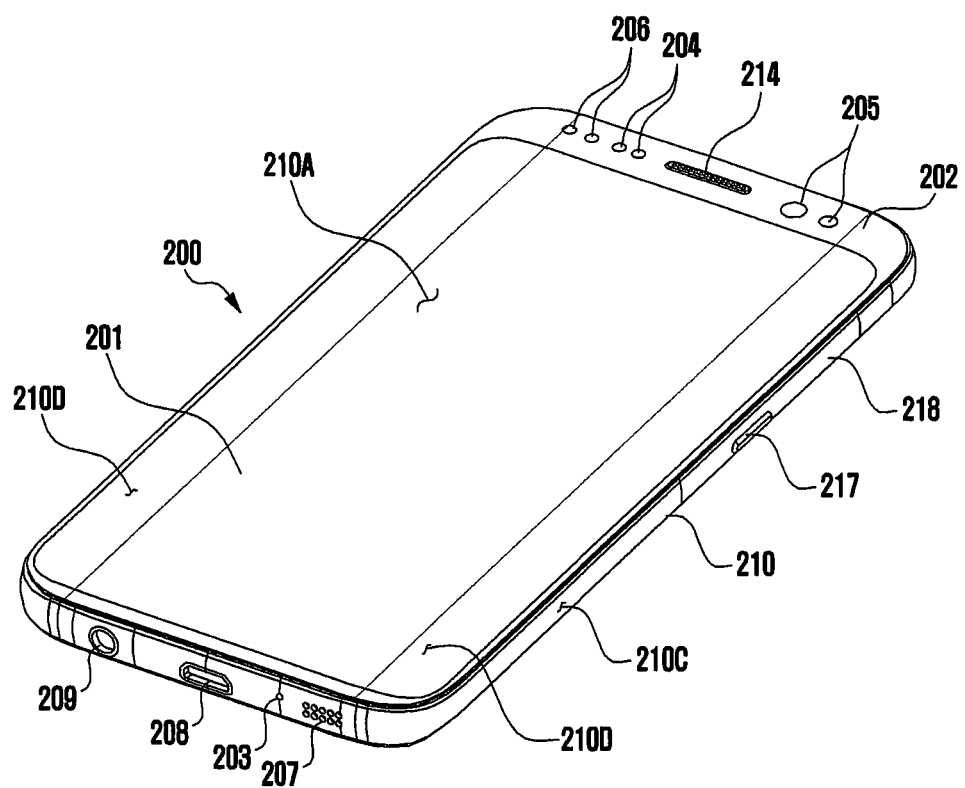
FIG. 2 is a perspective view of the front surface of a mobile electronic device according to an embodiment.
Figure 3:
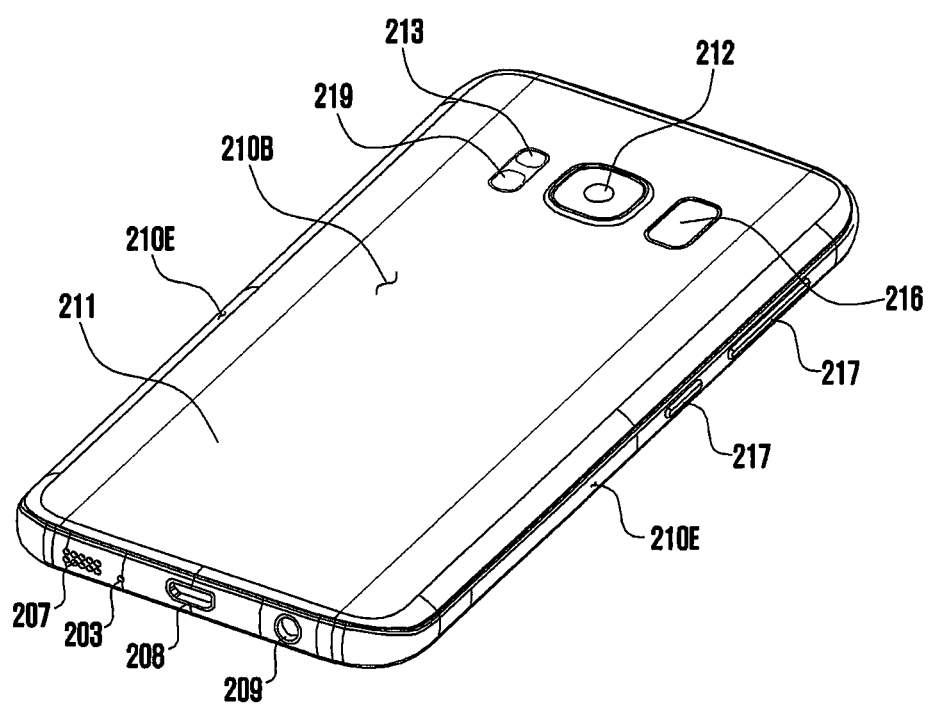
FIG. 3 is a perspective view of the rear surface of the electronic device of FIG. 2.

Referring to FIG. 2 and FIG. 3, an electronic device 200 according to an embodiment may include a housing 210 including a first surface (or front surface) 210A, a second surface (or rear surface) 210B, and a side surface 210C surrounding the space between the first surface 210A and the second surface 210B. In another embodiment (not illustrated), the housing may denote a structure that forms a part of the first surface 210A, the second surface 210B, and the side surface 210C illustrated in FIG. 2. According to an embodiment, the first surface 210A may be formed by a front plate 202, at least a part of which is substantially transparent (for example, a glass plate including various coating layers, or a polymer plate). The second surface 210B may be formed by a rear plate 211 that is substantially opaque. The rear plate 211 may be made of coated or colored glass, ceramic, polymer, metal (for example, aluminum, stainless steel (STS), or magnesium), or a combination of at least two of the above-mentioned materials. The side surface 210C may be formed by a side bezel structure (or "side member") 218 which is coupled to the front plate 202 and to the rear plate 211, and which includes metal and/or polymer. In some embodiments, the rear plate 211 and the side bezel structure 218 may be formed integrally and may include the same material (for example, a metal material such as aluminum).

In the illustrated embodiment, the front plate 202 may include two first areas 210D on both ends of the long edge of the front plate 202 such that the two first areas 210D bend from the first surface 210A toward the rear plate 211 and extend seamlessly. In the illustrated embodiment (see FIG. 3), the rear plate 211 may include two second areas 210E on both ends of the long edge such that the two second areas 210E bend from the second surface 210B toward the front plate 202 and extend seamlessly. In some embodiments, the front plate 202 (or the rear plate 211) may include only one of the first areas 210D (or the second areas 210E). In another embodiment, a part of the first areas 210D or the second areas 210E may not be included. In the above embodiments, when seen from the side surface of the electronic device 200, the side bezel structure 218 may have a first thickness (or width) on a part of the side surface, which does not include the first areas 210D or the second areas 210E as described above, and may have a second thickness that is smaller than the first thickness on a part of the side surface, which includes the first areas 210D or the second areas 210E.

According to an embodiment, the electronic device 200 may include at least one of a display 201, audio modules 203, 207, and 214, sensor modules 204, 216, and 219, camera modules 205, 212, and 213, a key input device 217, a light-emitting element 206, and connector holes 208 and 209. In some embodiments, at least one of the constituent elements (for example, the key input device 217 or the light-emitting element 206) of the electronic device 200 may be omitted, or the electronic device 200 may additionally include another constituent element.

The display 201 may be exposed through a corresponding part of the front plate 202, for example. In some embodiments, at least a part of the display 201 may be exposed through the front plate 202 that forms the first areas 210D of the side surface 210C and the first surface 210A. In some embodiments, the display 201 may have a corner formed in substantially the same shape as that of the adjacent outer periphery of the front plate 202. In another embodiment (not illustrated), in order to increase the area of exposure of the display 201, the interval between the outer periphery of the display 201 and the outer periphery of the front plate 202 may be formed to be substantially identical.

In another embodiment (not illustrated), a recess or an opening may be formed in a part of the screen display area of the display 201, and at least one of an audio module 214, a sensor module 204, a camera module 205, and a light-emitting element 206 may be included and aligned with the recess or the opening. In another embodiment (not illustrated), on the back surface of the screen display area of the display 201, at least one of an audio module 214, a sensor module 204, a camera module 205, a fingerprint sensor 216, and a light-emitting element 206 may be included. In another embodiment (not illustrated), the display 201 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 204 and 219 and/or at least a part of the key input device 217 may be arranged in the first areas 210D and/or the second areas 210E.

The audio modules 203, 207, and 214 may include a microphone hole 203 and speaker holes 207 and 214. A microphone for acquiring an external sound may be arranged in the microphone hole 203, and a plurality of microphones may be arranged therein such that the direction of a sound can be sensed in some embodiments. The speaker holes 207 and 214 may include an outer speaker hole 207 and a speech receiver hole 214. In some embodiments, the speaker holes 207 and 214 and the microphone hole 203 may be implemented as a single hole, or a speaker may be included (for example, a piezoelectric speaker) without the speaker holes 207 and 214.

The sensor modules 204, 216, and 219 may generate an electric signal or a data value corresponding to the internal operating condition of the electronic device 200 or the external environment condition thereof. The sensor modules 204, 216, and 219 may include, for example, a first sensor module 204 (for example, a proximity sensor) arranged on the first surface 210A of the housing 210, and/or a second sensor module (not illustrated) (for example, a fingerprint sensor), and/or a third sensor module 219 (for example, an FIRM sensor) arranged on the second surface 210B of the housing 210, and/or a fourth sensor module 216 (for example, a fingerprint sensor). The fingerprint sensor may be arranged not only on the first surface 210A (for example, the display 201) of the housing 210, but also on the second surface 210B thereof. The electronic device 200 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 204.

The camera modules 205, 212, and 213 may include a first camera device 205 arranged on the first surface 210A of the electronic device 200, a second camera device 212 arranged on the second surface 210B thereof, and/or a flash 213. The camera devices 205 and 212 may include a single lens or a plurality of lenses, an image sensor, and/or an image signal processor. The flash 213 may include, for example, a light-emitting diode or a xenon lamp. In some embodiments, two or more lenses (an infrared camera, a wide-angle lens, and a telephoto lens) and image sensors may be arranged on a single surface of the electronic device 200.

The key input device 217 may be arranged on the side surface 210C of the housing 210. In another embodiment, the electronic device 200 may not include a part of the above-mentioned key input device 217 or the entire key input device 217, and the key input device 217 (not included) may be implemented in another type, such as a soft key, on the display 201. In some embodiments, the key input device may include a sensor module 216 arranged on the second surface 210B of the housing 210.

The light-emitting element 206 may be arranged on the first surface 210A of the housing 210, for example. The light-emitting element 206 may provide information regarding the condition of the electronic device 200 in a light type, for example. In another embodiment, the light-emitting element 206 may provide a light source that interworks with operation of the camera module 205, for example. The light-emitting element 206 may include, for example, an LED, an IR LED, and a xenon lamp.

The connector holes 208 and 209 may include a first connector hole 208 capable of containing a connector (for example, a USB connector) for transmitting/receiving power and/or data to/from an external electronic device, and/or a second connector hole (for example, an earphone jack) 209 capable of containing a connector for transmitting/receiving an audio signal to/from the external electronic device.

Figure 4:
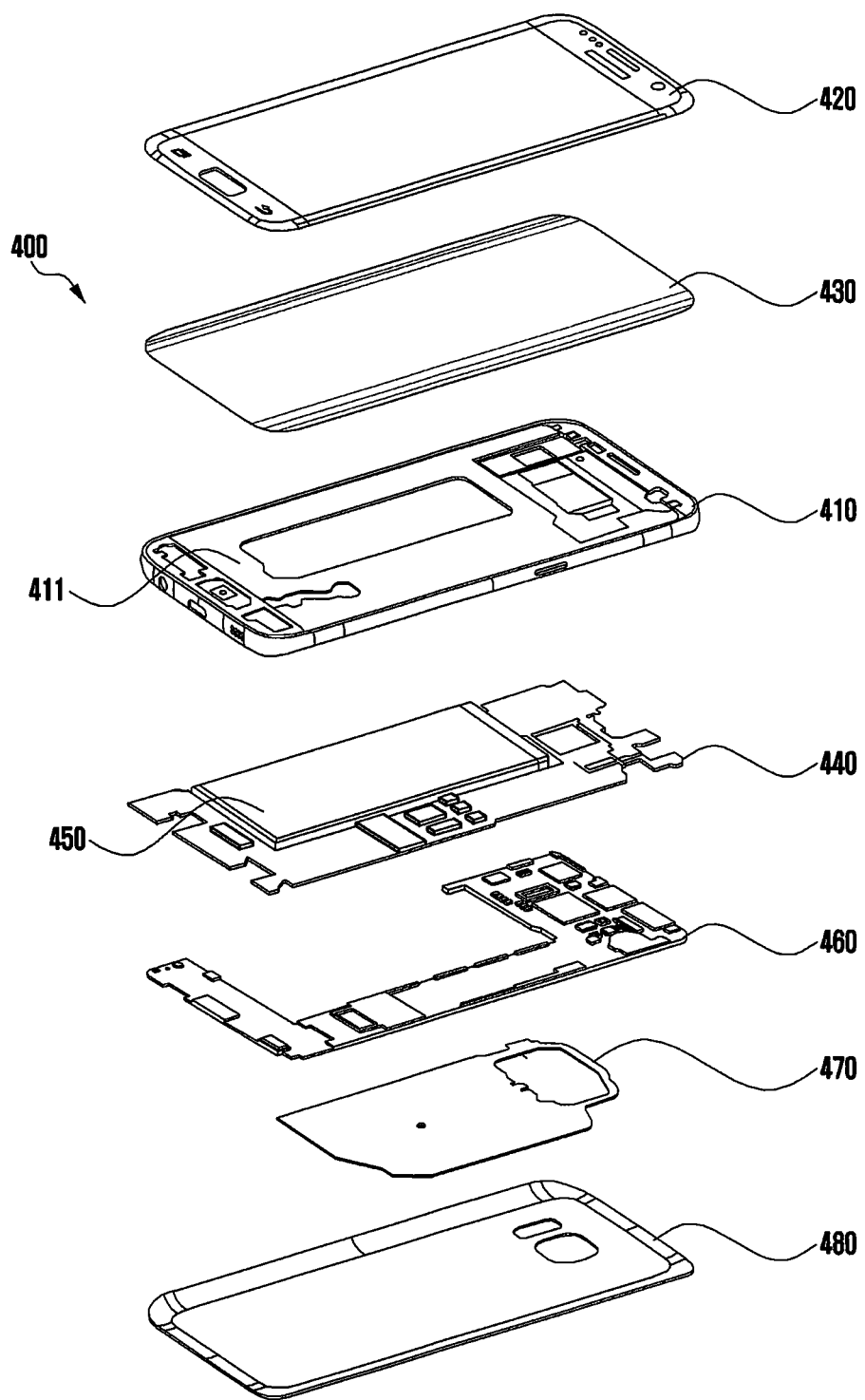
FIG. 4 is a developed perspective view of the electronic device of FIG. 2.

Referring to FIG. 4, the electronic device 400 may include a side bezel structure 410, a first support member 411 (for example, a bracket), a front plate 420, a display 430, a printed circuit board 440, a battery 450, a second support member 460 (for example, a rear case), an antenna 470, and a rear plate 480. In some embodiments, at least one of the constituent elements (for example, the first support member 411 or the second support member 460) of the electronic device 400 may be omitted, or the electronic device 400 may further include another constituent element. At least one of the constituent elements of the electronic device 400 may be identical or similar to at least one of the constituent elements of the electronic device 200 of FIG. 2 or FIG. 3, and repeated descriptions thereof will be omitted herein.

The first support member 411 may be arranged inside the electronic device 400 and connected to the side bezel structure 410, or may be formed integrally with the side bezel structure 410. The first support member 411 may be made of a metal material and/or a nonmetal (for example, polymer) material, for example. The display 430 may be coupled to one surface of the first support member 411, and the printed circuit board 440 may be coupled to the other surface thereof. A processor, a memory, and/or an interface may be mounted on the printed circuit board 440. The processor may include, for example, one or more of a central processing device, an application processor, a graphic processing device, an image signal processor, an sensor hub processor, or a communication processor.

The memory may include a volatile memory or a non-volatile memory, for example.

The interface may include, for example, a high definition multimedia interface (HDMI), a universal serial bus (USB) interface, an SD card interface, and/or an audio interface. The interface may connect the electronic device 400 with an external electronic device electrically or physically, for example, and may include a USB connector, an SD card/MMC connector, or an audio connector.

The battery 450 is an device for supplying power to at least one constituent element of the electronic device 400, and may include a non-rechargeable primary cell, a rechargeable secondary cell, or a fuel cell, for example. At least a part of the battery 450 may be arranged on substantially the same plane with the printed circuit board 440, for example. The battery 450 may be arranged integrally inside the electronic device 400, or may be arranged such that the same can be attached to/detached from the electronic device 400.

The antenna 470 may be arranged between the rear plate 480 and the battery 450. The antenna 470 may include, for example, a near field communication (NFC) antenna, a wireless charging antenna, and/or a magnetic secure transmission (MST) antenna. The antenna 470 may conduct near-field communication with an external device or may wirelessly transmit/receive power necessary for charging, for example. In another embodiment, an antenna structure may be formed by a part or a combination of the side bezel structure 410 and/or the first support member 411.

According to various embodiments of the disclosure, an electronic device (e.g., the electronic device 101 in FIG. 1) may include: a first circuit board (e.g., the first circuit board 510 in FIG. 5); a second circuit board (e.g., the second circuit board 520 in FIG. 5); one or more circuit elements disposed on the second circuit board 520; a connecting member (e.g., the connecting member 530 in FIG. 5) disposed between the first circuit board 510 and the second circuit board 520 facing the first circuit board 510 to form an internal space surrounding at least some of the one or more circuit elements, and to electrically connect the first circuit board 510 and the second board 520; and a phase change material (PCM) (e.g., the phase change material 711 in FIG. 7) disposed in the internal space and configured to change the state thereof by absorbing heat generated by the at least some circuit elements. The phase change material 711 may be a material in which the state thereof changes from a solid phase to a liquid phase by absorbing thermal energy. The phase change material 711 may include an organic material. The electronic device may further include at least one conductive material disposed in the internal space. The at least one conductive material may be wrapped by a non-conductive capsule (e.g., the non-conductive capsule 911 in FIG. 9). The phase change material 711 may include paraffin wax, and the at least one conductive material may include graphite. The electronic device may further include: a first resin applied to at least a portion between the first circuit board 510 and the connecting member 530; and a second resin applied to at least a portion between the second circuit board 520 and the connecting member 530, wherein the first resin and the second resin may block the phase change material 711 from passing therethrough from the internal space to the outside.

According to various embodiments, an electronic device (e.g., the electronic device 101 in FIG. 1) may include: a first circuit board (e.g., the first circuit board 510 in FIG. 5); a second substrate (e.g., the second circuit board 520 in FIG. 5) facing the first substrate 510; a connecting member (e.g., the connecting member 530 in FIG. 5) disposed between the first circuit board 510 and the second circuit board 520 to form an internal space, and to electrically connect the first circuit board 510 and the second board 520; and a phase change material (PCM) (e.g., the phase change material 711 in FIG. 7) disposed in the internal space and configured to change a state thereof by absorbing thermal energy. The electronic device may further include one or more circuit elements disposed on the second circuit board 520. The phase change material 711 may be a material in which the state thereof changes from a solid phase to a liquid phase by absorbing thermal energy. The phase change material 711 may include an organic material. The electronic device may further include at least one conductive material disposed in the internal space. The at least one conductive material may be wrapped by a non-conductive capsule (e.g., the non-conductive capsule 911 in FIG. 9). The phase change material 711 may include paraffin wax, and the at least one conductive material may include graphite. The electronic device may further include: a first resin applied to at least a portion between the first circuit board 510 and the connecting member 530; and a second resin applied to at least a portion between the second circuit board 520 and the connecting member 530, wherein the first resin and the second resin may block the phase change material 711 from passing therethrough.

Figure 5:
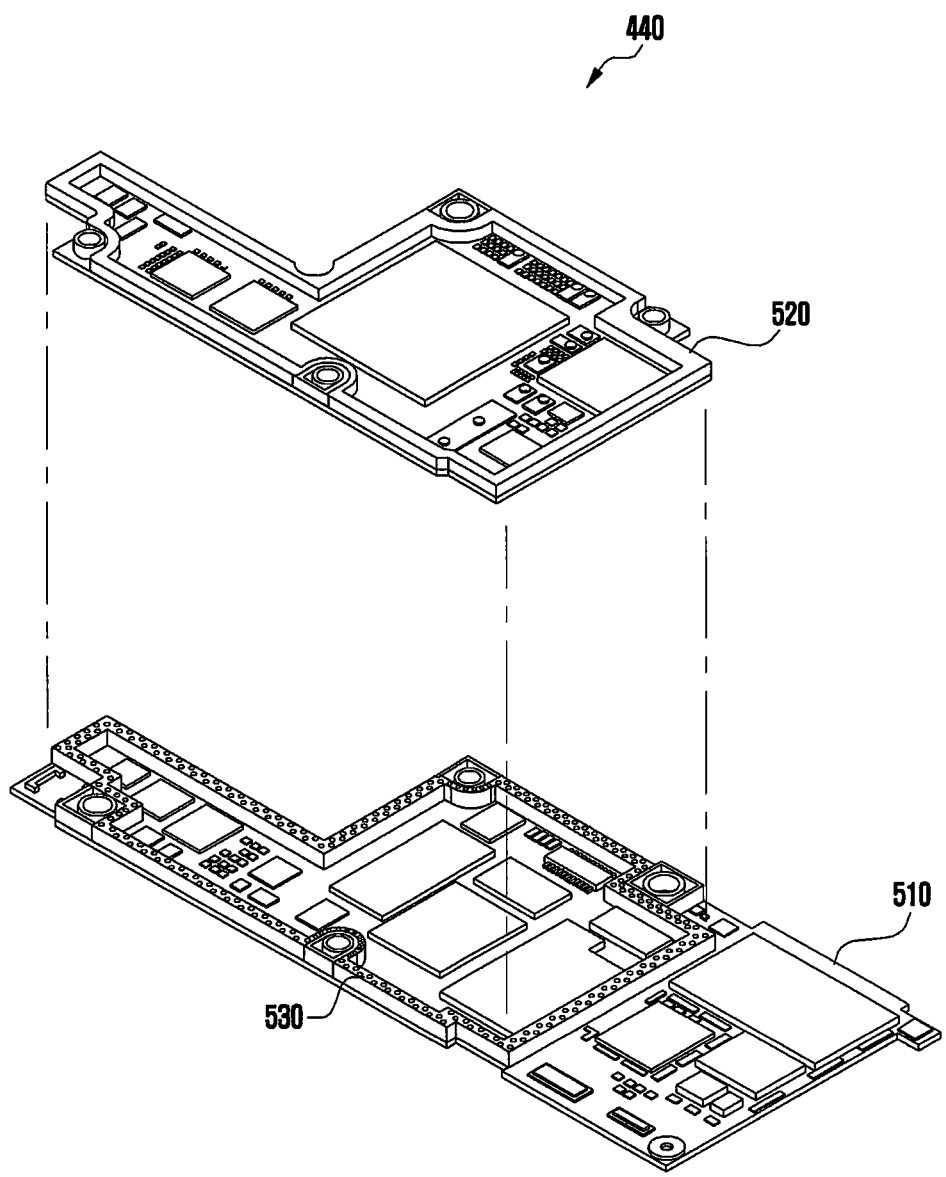
FIG. 5 is a perspective view of a printed circuit board according to an embodiment of the disclosure.
Figure 6:
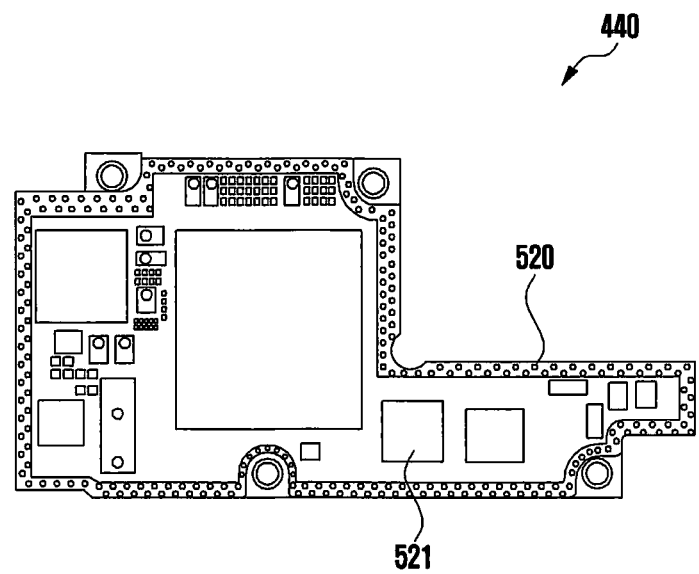
FIG. 6 is a plan view of a printed circuit board according to an embodiment of the disclosure.
Figure 6:
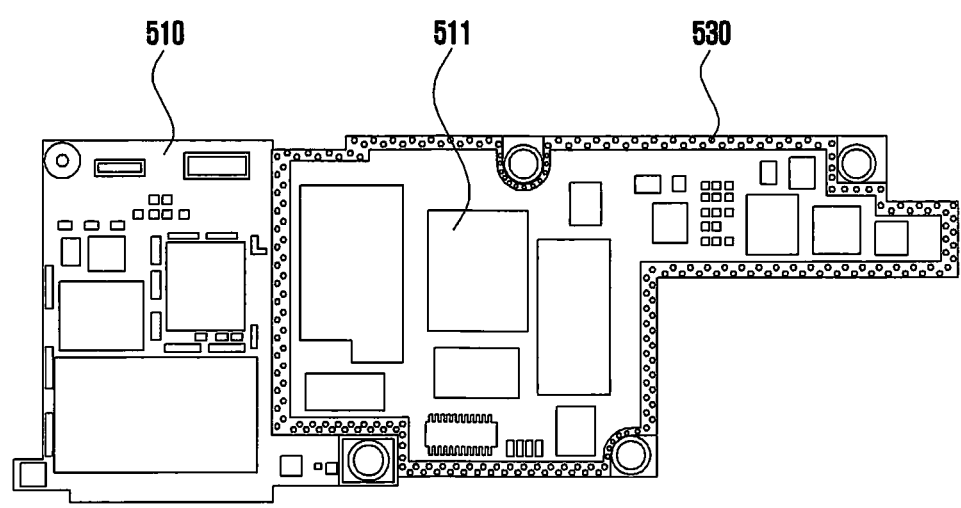

FIG. 5 is a perspective view of a printed circuit board according to an embodiment of the disclosure. FIG. 6 is a plan view of a printed circuit board according to an embodiment of the disclosure.

Referring to FIGS. 5 and 6, the printed circuit board (e.g., the printed circuit board 440 in FIG. 4) according to an embodiment of the disclosure may be a stack-up printed circuit board. For example, the printed circuit board 440 may include a first circuit board 510 and a second circuit board 520 facing the first circuit board 510.

According to an embodiment, at least a portion of the first circuit board 510 and the second circuit board 520 are disposed to overlap, and the second circuit board 520 may be stacked on the first circuit board 510, or the first circuit board 510 may be stacked on the second circuit board 520. In the illustrated example, the second circuit board 520 is stacked on the first circuit board 510, but various embodiments of the disclosure may not be limited to the illustrated example.

According to an embodiment, the first circuit board 510 and the second circuit board 520 may be electrically connected via a connection member 530. For example, the connecting member 530 may be disposed to surround a region in which the first circuit board 510 and the second circuit board 520 overlap each other. As another example, when the first circuit board 510 has a first area and the second circuit board 520 has a second area smaller than the first area, the connecting member 530 may be disposed to overlap the boundary portion (e.g., the peripheral portion) of the second circuit board 520.

According to an embodiment, the first circuit board 510 may be a single-sided printed circuit board having a wiring line provided on only one side of an insulating board and at least one circuit element mounted on the one side thereof, or a double-sided printed circuit board having a wiring line provided on each side of an insulating board and at least one circuit element mounted on each side thereof. For example, the first circuit board 510 may include at least one first circuit element 511 mounted on the surface thereof which faces the second circuit board 520.

According to an embodiment, the second circuit board 520 may be a single-sided printed circuit board having a wiring line provided on only one side of an insulating board and at least one circuit element mounted on the one side thereof, or a double-sided printed circuit board having a wiring line provided on each side of an insulating board and at least one circuit element mounted on each side thereof. For example, the second circuit board 520 may include at least one second circuit element 521 mounted on the surface thereof which faces the first circuit board 510.

According to an embodiment, the at least one electronic component (e.g., the first circuit element 511 or the second circuit element 521 illustrated in FIG. 6) mounted on the printed circuit board 440 may include a central processing unit, an application processor, a graphic processing device, an image signal processor, a sensor hub processor, a communication processor, a power amp module (PAM), a power management integrated circuit (PMIC), a charging IC, or the like.

Figure 7:
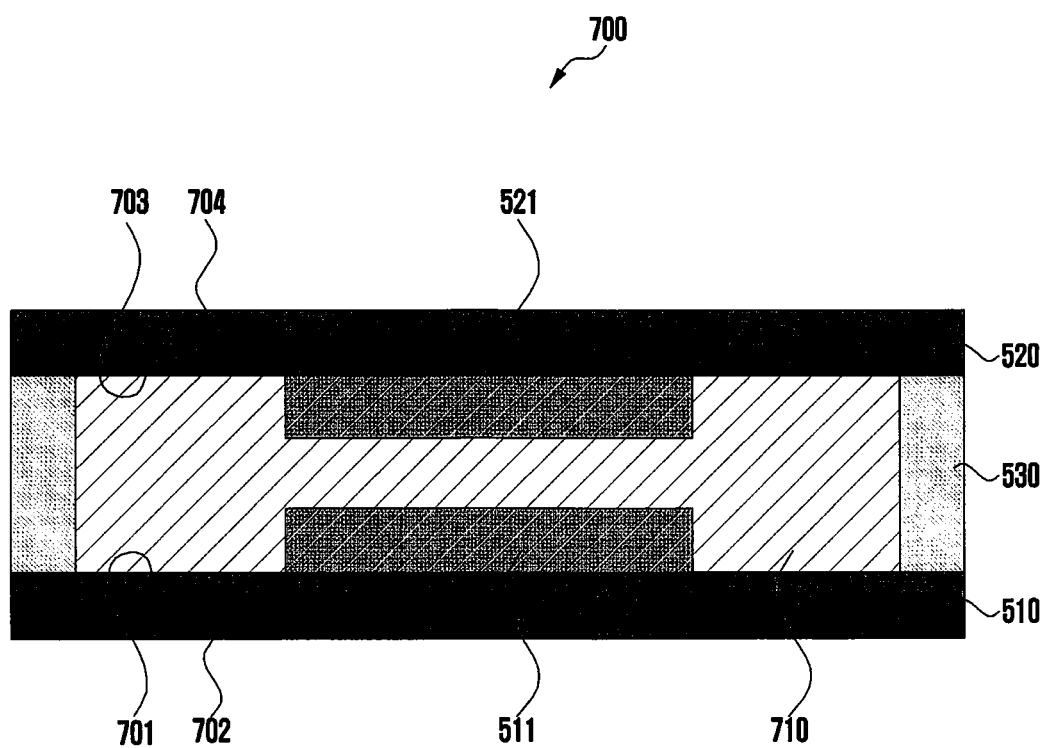
FIG. 7 is a schematic cross-sectional view of a printed circuit board according to an embodiment of the disclosure.

FIG. 7 is a schematic cross-sectional view of a printed circuit board according to an embodiment of the disclosure.

Referring to FIG. 7, according to an embodiment, a printed circuit board 700 (e.g., the printed circuit board 440 in FIG. 4) may include a first printed circuit board 510 (e.g., the printed circuit board 510 in FIG. 5) and a second printed circuit board 520 (e.g., the second printed circuit board 520 in FIG. 5), and the first printed circuit board 510 and the second circuit board 520 may be electrically connected to each other via a connecting member 530 (e.g., the connecting member 530 in FIG. 5).

According to an embodiment, the connecting member 530 may be disposed between the first circuit board 510 and the second circuit board 520 so as to form an internal space 710. For example, the connecting member 530 may be disposed to at least some circuit elements disposed between the first circuit board 510 and the second circuit board 520, thereby defining the internal space 710.

According to an embodiment, at least one first circuit component 511 mounted on the first circuit board 510 and at least one second circuit component 521 mounted on the second circuit board 520 may be disposed in the internal space 710. For example, the first circuit board 510 may include a first surface 701 facing the second circuit board 520 and a second surface 702 facing away from the first surface 701, and at least one first circuit element 511 may be mounted on the first surface 701. For example, the second circuit board 520 may include a third surface 703 facing the first circuit board 510 and a fourth surface 704 facing away from the third surface 703, and at least one second circuit element 521 may be mounted on the third surface 703. According to an embodiment, the first surface 701 of the first circuit board 510 may face the third surface 703 of the second circuit board 520.

According to an embodiment, the connecting member 530 may be an interposer that connects at least some circuits of the first circuit board 510 and at least some circuits of the second circuit board 520, and may be a connector or an electrical interface routing.

According to an embodiment, a phase change material (PCM) 711 in which the state thereof changes by absorbing heat generated from the at least some circuit elements (e.g., the first circuit device 511 or the second circuit element 521 in FIG. 7) may be disposed in the internal space 710 between the first circuit board 510 and the second circuit board 520.

In an electronic device according to various embodiments, since the phase change material 711 is disposed in the internal space 710 between the first circuit board 510 and the second circuit board 520, it is possible to increase the flow of heat generated from the at least some circuit elements 511 and 521 by removing air from the internal space 710. For example, the phase change material 711 is capable of absorbing heat generated from the at least some circuit elements 511 and 521 to delay the temperature rise of the surfaces of the first and second circuit boards 510 and 520, and to delay the temperature rise of the at least some circuit elements 511 and 521.

According to an embodiment, the phase change material 711 may be a material that stores/releases energy using latent heat generated during a phase change. It is known that phase change materials 711 are classified into a liquid-gas type, a solid-solid type, and a solid-liquid type according to the type of the phase change. A liquid-gas type phase change material may be a phase change material in which the state thereof changes from a liquid phase to a gas phase by absorbing thermal energy. A solid-solid type phase change material may be a phase change material that maintains a solid phase even when it absorbs thermal energy. A solid-liquid type phase change material may be a phase change material in which the state thereof changes from a solid phase to a liquid phase by absorbing thermal energy.

The liquid-gas type phase change material has a relatively high latent heat, but requires a large volume in the gas phase, and the solid-solid type phase change material has a relatively low latent heat. Thus, the phase change material 711 according to an embodiment may be a solid-liquid type phase change material.

The solid-liquid type phase change material 711 may be classified into an organic material and an inorganic material. Since an inorganic phase change material has a disadvantage of causing corrosion of an electronic device, the phase change material 711 according to an embodiment may be an organic material.

Table 1 may represent examples of phase change materials 711, which are organic materials according to an embodiment.

TABLE 1

| PCM | Melting temperature (° C.) | Latent Heat (kJ/kg) | Density (Kg/m$^3$) | Thermal Conductivity (w/m-K) |
|---|---|---|---|---|
| n-Octadecane | 28.0 | 244 | 865 (solid) | 0.358 (solid) |
|  |  |  | 780 (liquid) | 0.148 (liquid) |
| n-Eicosane | 37.0 | 241 | 810 (solid) | 0.39 (solid) |
|  |  |  | 770 (liquid) | 0.157 (liquid) |
| Capric | 31.5 | 153 | 884 (40° C.) | 2.0 |
| Capric | 16.3 | 149 | 1033 (10° C.) | 2.0 |
|  |  |  | 861 (80° C.) |  |
| Zn(NO3)6H2O | 36.4 | 147 | 2065 (solid) | 0.31 |
| Lauric acid | 41.5 | 178 | 800 | 0.2 |
| Paraffin wax | 49-62 | 210 | 916 (solid) | 0.346 (solid) |
|  |  |  | 770 (liquid) | 0.167 (liquid) |
| RT27 | 26-28 | 179 | 870 (solid) | 0.2 |
|  |  |  | 750 (liquid) |  |
| RT25 | 25 | 147 | 804 (solid) | 0.19 (solid) |
|  |  |  | 763 (liquid) | 0.17 (liquid) |
| P116 | 47.0 | 225 | 830 (solid) | 0.24 |
|  |  |  | 773 (liquid) |  |

Among the phase change materials (PCMs) 711 shown in Table 1, paraffin wax has high electrical resistance, is not corrosive, and has high stability during a thermal cycle. Thus, paraffin wax may be suitable as the phase change material 711 according to various embodiments of the disclosure.

Figure 8:
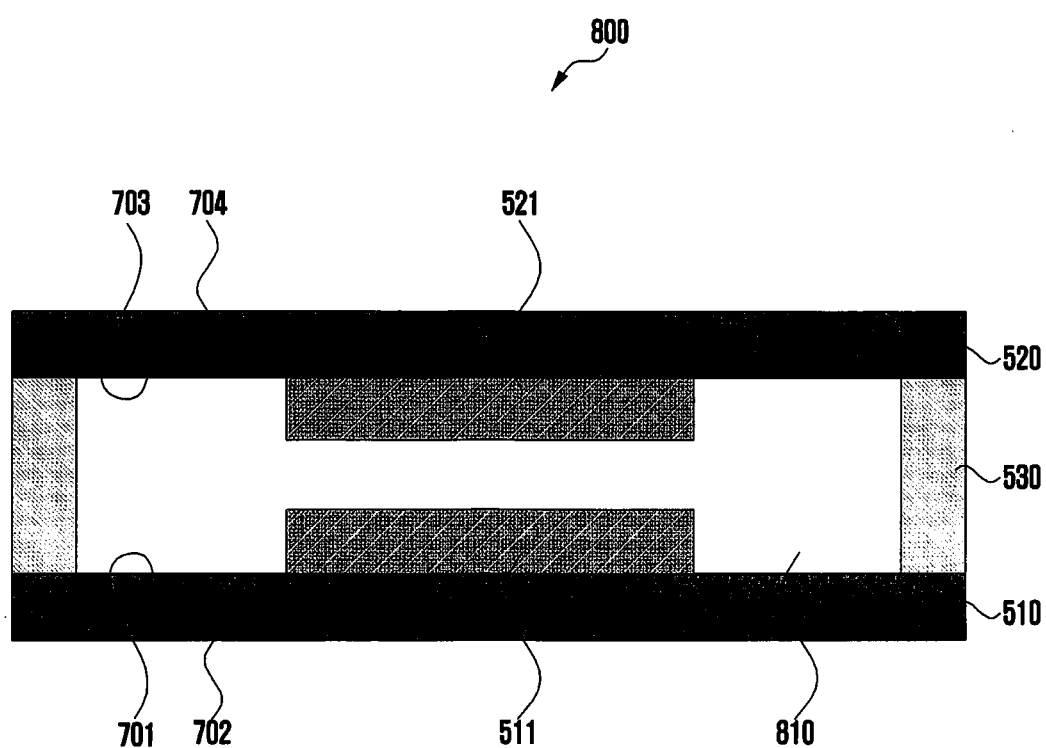
FIG. 8 is a schematic cross-sectional view of a printed circuit board according to a comparative example.

FIG. 8 is a schematic cross-sectional view of a printed circuit board according to a comparative example.

Referring to FIG. 8, unlike the printed circuit board 700 illustrated in FIG. 7, a printed circuit board 800 according to the comparative example may not have the phase change material (e.g., the phase change material 711 in FIG. 7) disposed in the internal space 710 (e.g., the internal space 710 in FIG. 7) between the first circuit board 510 and the second circuit board 520, but may have an air layer 810 formed in the internal space 710.

Since the air layer 810 has a lower thermal conductivity than the phase change material 711 and is not capable of absorbing or dissipating thermal energy, flow (e.g., dissipation/transfer speed) of heat generated from the at least some circuit elements (e.g., the first circuit element 511 or the second circuit element 521 in FIG. 7) in the printed circuit board 800 according to the comparative example may be reduced compared to that in the printed circuit board 700 according to various embodiment of the disclosure.

Figure 9:
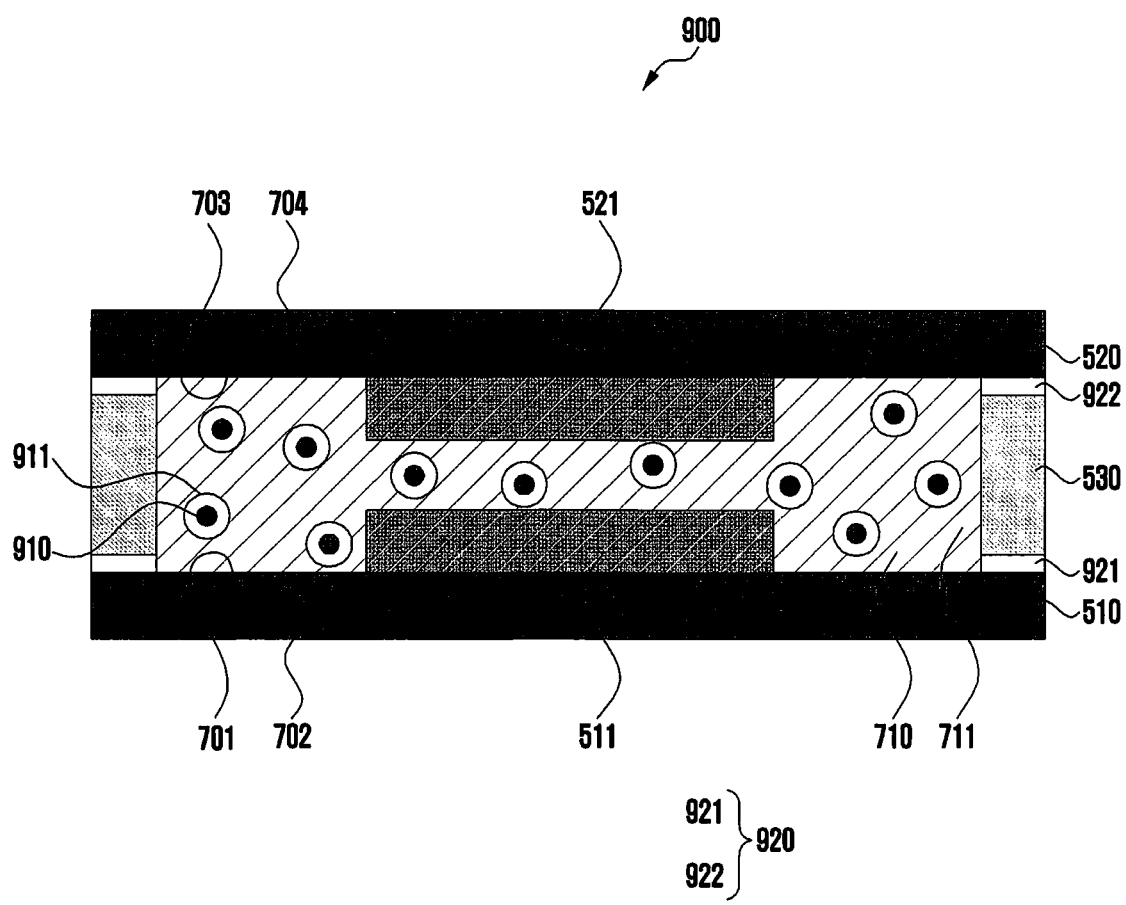
FIG. 9 is a schematic cross-sectional view of a printed circuit board according to another embodiment of the disclosure.
Figure 10:
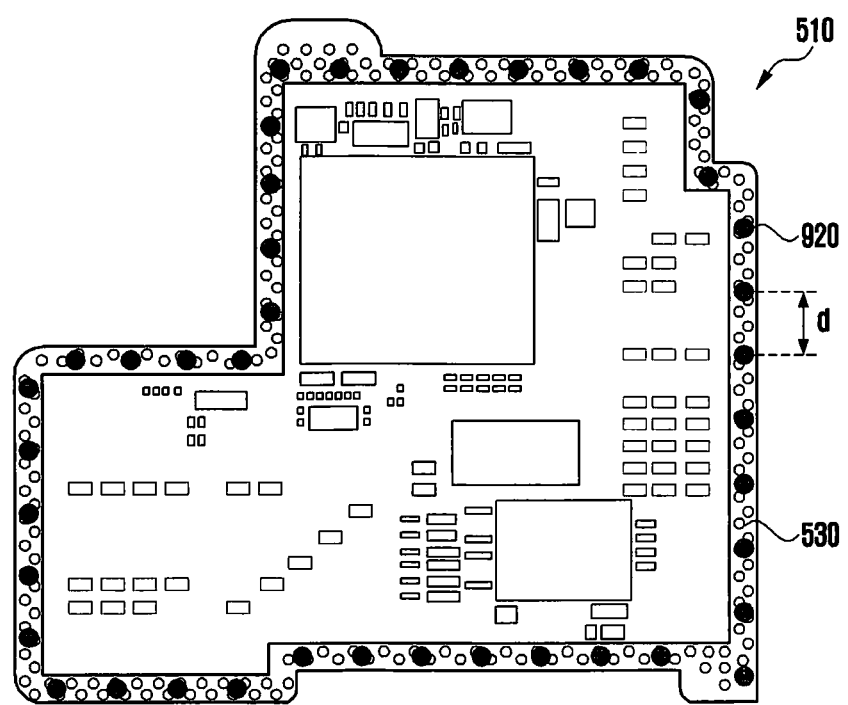
FIG. 10 is a plan view of a printed circuit board according to another embodiment of the disclosure.

FIG. 9 is a schematic cross-sectional view of a printed circuit board according to another embodiment of the disclosure. FIG. 10 is a plan view illustrating a portion of a printed circuit board according to another embodiment of the disclosure. For example, FIG. 10 may be a plan view of the first circuit board 510 illustrated in FIG. 9 viewed from above the first surface 701.

Except for the components described below, the printed circuit board 900 illustrated in FIGS. 9 and 10 may be substantially the same as or similar to the printed circuit board 700 illustrated in FIG. 7. In FIGS. 9 and 10, the components substantially the same as or similar to those of the electronic device 700 illustrated in FIG. 7 are denoted by the same reference numerals, and the descriptions made above with reference to FIG. 7 will apply, mutatis mutandis, to the components denoted by the same reference numerals as those of the printed circuit board 700 illustrated in FIG. 7.

Referring to FIG. 9, a printed circuit board 900 (e.g., the printed circuit board 440 in FIG. 4) according to another embodiment may further include at least one conductive material 910 disposed in the internal space 710 (e.g., the internal space 710 in FIG. 7) between a first circuit board 510 (e.g., the first circuit board 510 in FIG. 5) and a second circuit board 520 (e.g., the second circuit board 520 in FIG. 5).

The phase change materials (PCMs) 711 shown in Table 1 have low thermal conductivity, and may have insufficient specifications to replace a thermal interface material. In the printed circuit board 900 according to another embodiment of the disclosure, at least one conductive material 910 may be further disposed in the internal space 711 in order to compensate for the low thermal conductivity of the phase change material 711. For example, the at least one conductive material 910 may be a material having a higher thermal conductivity than the phase change material 711.

According to an embodiment, the at least one conductive material 910 may include graphite.

TABLE 2

| Material | PCM |
|---|---|
| Type | Paraffin/Graphite Composite |
| Phase Transition Temperature | 42-45° C. |
| Latent Heat of Fusion | 180 kJ/kg |
| Thermal Conductivity | 1.2 W/mK |
| Specific Gravity | 0.8 g/cm3 |

Referring to Table 2, it can be seen that the composite material obtained by mixing paraffin wax, which is a phase change material 711, and graphite has a thermal conductivity of about 1.2 W/mK, which is increased compared to about 0.346 W/mK or about 0.167 W/mK, which is the thermal conductivity of paraffin wax.

According to an embodiment, the at least one conductive material 910 may be wrapped by a non-conductive capsule 911. For example, the at least one conductive material 910 has a higher thermal conductivity than the phase change material 711, but is electrically conductive. Thus, the conductive material 910 may cause malfunction of at least one circuit element 511 or 521 disposed in the inner space 710. In the printed circuit board 900 according to various embodiments of the disclosure, by wrapping the at least one conductive material 910 with a non-conductive capsule 911, it is possible to prevent the malfunction of the circuit elements 511 and 521 while increasing the thermal conductivity.

According to an embodiment, the printed circuit board 900 may further include a resin 920 configured to block, when the phase change material 711 changes to a liquid phase, the phase change material 711, which is in the liquid phase, so as to prevent the phase change material 711 from escaping to the outside of the internal space 710.

For example, the resin 920 may include a first resin 921 applied to at least a portion between the first circuit board 510 and the connection member 530, and a second resin 922 applied to at least a portion between the second circuit board 520 and the connecting member 530.

According to an embodiment, the first resin 921 and the second resin 922 may block the phase change material 711, which is the liquid phase, so as to prevent the liquid phase material 711 from passing therethrough from the internal space 710 to the outside.

Referring to FIG. 10, the resins 920 (e.g., the resin 920 in FIG. 9) according to an embodiment may be disposed to overlap a portion of the connecting member 530 (e.g., the connecting member 530 in FIG. 9), and may be arranged at a specified interval (e.g., the specified interval d indicated in FIG. 10).

According to another embodiment, unlike the illustrated example, the resin 920 may be continuously disposed so as to overlap the connecting member 530. For example, the resin 920 may be formed to surround the internal space 710 like the connecting member 530.

Figure 11:
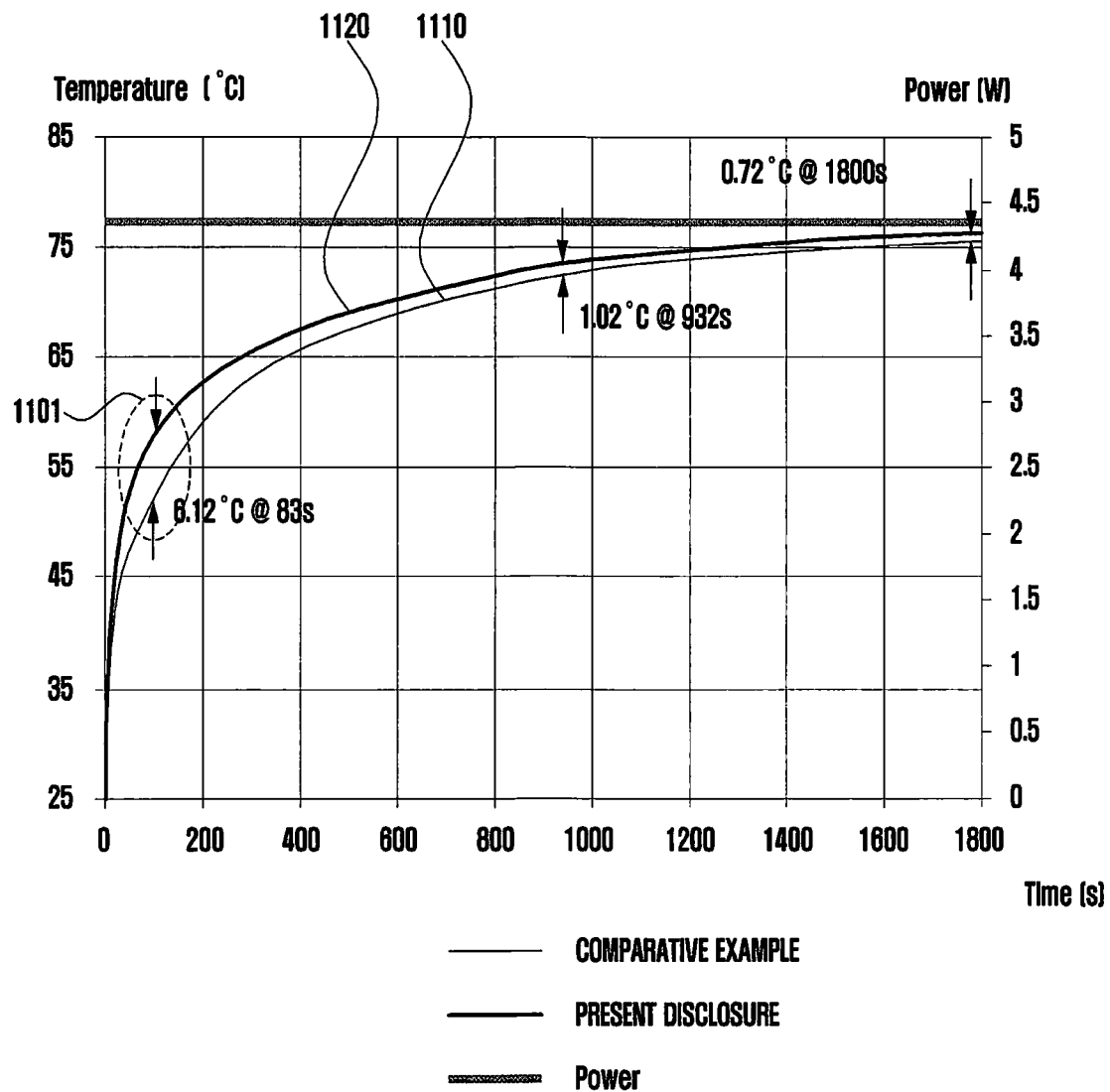
FIG. 11 illustrates test results obtained by measuring heat generation by components in an electronic device according to an embodiment of the disclosure.

FIG. 11 is a view showing test results obtained by measuring heat generation by components in a printed circuit board according to an embodiment of the disclosure. The test results of FIG. 11 were obtained, for example, under the condition in which power was continuously supplied to a designated circuit element (e.g., the first circuit element 511 of FIG. 9) disposed on the printed circuit board (e.g., the printed circuit board 900 in FIG. 9). In FIG. 11, graph 1110 was obtained by measuring heat generated from a component in the printed circuit board 900 according to an embodiment of the disclosure under the above-mentioned condition. In FIG. 11, graph 1120 was obtained by measuring heat generated from a component in a printed circuit board according to the comparative example (e.g., the printed circuit board 800 in FIG. 8) under the above-mentioned condition.

Referring to FIG. 11, it can be seen that, in the initial section (e.g., the section 1101 in FIG. 11) in which power supply is started, the temperature increase rate of the component in the disclosure is lowered. For example, in the initial section 1101, it can be seen that the temperature of the component according to the comparative example rises relatively rapidly, while the temperature of the component in the embodiment of the disclosure rises relatively gently. From the test results of FIG. 11, it can be seen that the temperature increase of the component is delayed by disposing the phase change material 711 in the printed circuit board 900 according to various embodiments of the disclosure.

Figure 12:
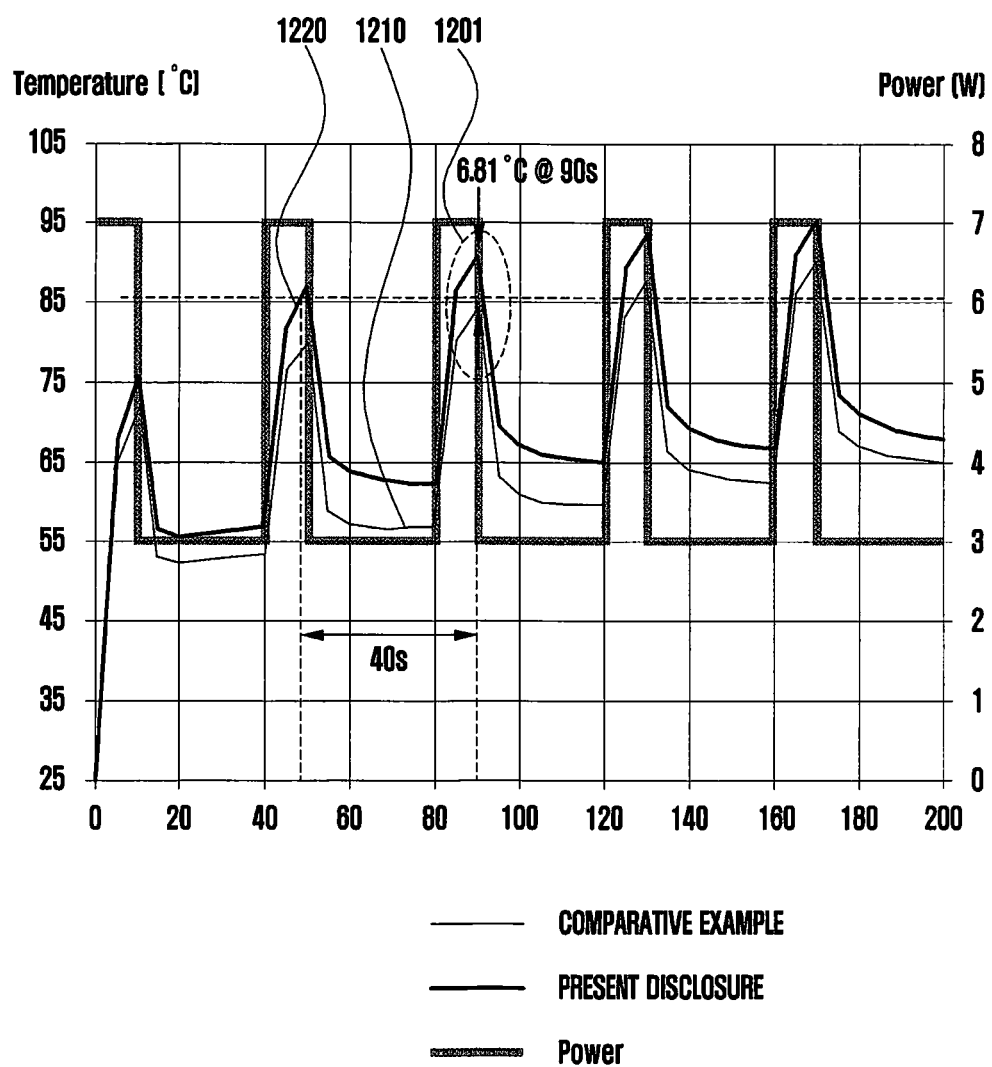
FIG. 12 illustrates other test results obtained by measuring heat generation by components in an electronic device according to an embodiment of the disclosure.

FIG. 12 is a view showing other test results obtained by measuring heat generation by components in an electronic device according to an embodiment of the disclosure. The test results of FIG. 12 were obtained, for example, under the condition in which power was intermittently supplied (e.g., in the state in which power was supplied while repeatedly turned on and off) to a designated circuit element disposed on the printed circuit board (e.g., the printed circuit board 900 in FIG. 9). In FIG. 12, graph 1210 was obtained by measuring heat generated from a component in the printed circuit board 900 according to an embodiment of the disclosure under the above-mentioned condition. In FIG. 12, graph 1220 was obtained by measuring heat generated from a component in a printed circuit board according to the comparative example (e.g., the printed circuit board 800 in FIG. 8) under the above-mentioned condition.

Referring to FIG. 12, it can be seen that, in the section in which peak power is supplied (e.g., the section 1201 in FIG. 12), the temperature increase rate of the component in the disclosure is lowered. For example, in the section 1201 in which the peak power is supplied, it can be seen that the temperature of the component according to the comparative example rises relatively rapidly, while the temperature of the component in the disclosure rises relatively gently. From the test results of FIG. 12, it can be seen that the temperature increase of the component is delayed by disposing the phase change material 711 in the printed circuit board 440 according to various embodiments of the disclosure.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a first circuit board;
   a second circuit board;

at least one circuit element disposed on the second circuit board;

a connecting member disposed between the first circuit board and the second circuit board facing the first circuit board to form an internal space surrounding the at least one circuit element, and to electrically connect the first circuit board and the second board;

a phase change material (PCM) disposed in the internal space and configured to change a state thereof by absorbing heat generated by the at least one circuit element;

a first resin applied to at least a portion between the first circuit board and the connecting member; and a second resin applied to at least a portion between the second circuit board and the connecting member, wherein the first resin and the second resin block the phase change material, which is in a liquid phase, from passing therethrough.

2. The electronic device of claim 1, wherein the phase change material changes from a solid phase to a liquid phase by absorbing thermal energy.

3. The electronic device of claim 2, wherein the phase change material includes an organic material.

4. The electronic device of claim 3, further comprising: at least one thermally conductive material disposed in the internal space.

5. The electronic device of claim 4, wherein the at least one thermally conductive material is wrapped by an electrically non-conductive capsule.

6. The electronic device of claim 5, wherein the phase change material is paraffin wax, and the at least one thermally conductive material includes graphite.

7. An electronic device comprising:
a first circuit board;
a second substrate facing the first substrate;

a connecting member disposed between the first circuit board and the second circuit board to form an internal space, and to electrically connect the first circuit board and the second board;

a phase change material (PCM) filling the internal space and configured to change a state thereof by absorbing thermal energy;

a first resin applied to at least a portion between the first circuit board and the connecting member; and a second resin applied to at least a portion between the second circuit board and the connecting member, wherein the first resin and the second resin block the phase change material, which is in a liquid phase, from passing therethrough.

8. The electronic device of claim 7, further comprising: one or more circuit elements disposed on the second circuit board.

9. The electronic device of claim 7, wherein the phase change material changes the state thereof from a solid phase to a liquid phase by absorbing thermal energy.

10. The electronic device of claim 9, wherein the phase change material includes an organic material.

11. The electronic device of claim 10, further comprising: at least one thermally conductive material disposed in the internal space.

12. The electronic device of claim 11, wherein the at least one conductive material is wrapped by an electrically non-conductive capsule.

13. The electronic device of claim 12, wherein the phase change material is paraffin wax, and the at least one thermally conductive material includes graphite.

* * * * *